United States Patent [19]

Ward et al.

[11] Patent Number: 4,535,302

[45] Date of Patent: Aug. 13, 1985

[54] MICROWAVE AMPLIFIER

[75] Inventors: Charles S. Ward; Richard W. Laton, both of Lexington; John A. Spada, Revere, all of Mass.

[73] Assignee: Raytheon Company, Lexington, Mass.

[21] Appl. No.: 558,217

[22] Filed: Dec. 5, 1983

[51] Int. Cl.$^3$ ............................................. H03F 3/60
[52] U.S. Cl. .............................. 330/287; 331/107 DP
[58] Field of Search .................... 330/56, 287; 331/96, 331/107 DP

[56] References Cited

U.S. PATENT DOCUMENTS

| | | | |
|---|---|---|---|
| 3,739,298 | 6/1973 | Kawakami | 331/107 DP X |
| 4,097,823 | 6/1978 | Jerinic et al. | 332/9 R |

FOREIGN PATENT DOCUMENTS 2709210  9/1978  Fed. Rep. of Germany... 33/107 DP

OTHER PUBLICATIONS

Robertson et al., "Coaxially Coupled Ridge Waveguide Tunable Oscillator", Conference: 1981 IEEE MTT-S, International Microwave Symposium Digest, Los Angeles, CA, USA, Jun. 15-19, 1981.
Mizushina et al., "The Ridged-Waveguide Mount for Broad-Band Operation of Solid-State Devices", *The Transactions of the IECE of Japan*, vol. E 60, No. 2, Feb. 1977, p. 102.

*Primary Examiner*—James B. Mullins
*Attorney, Agent, or Firm*—Philip J. McFarland; Joseph D. Pannone

[57] ABSTRACT

An improved microwave amplifier is shown to comprise an IMPATT diode in a coaxial circuit coupled to a section of double-ridged waveguide forming a resonant cavity with a low Q, such cavity in turn being coupled to outside circuitry through a compound iris.

1 Claim, 1 Drawing Figure

U.S. Patent  Aug. 13, 1985  4,535,302
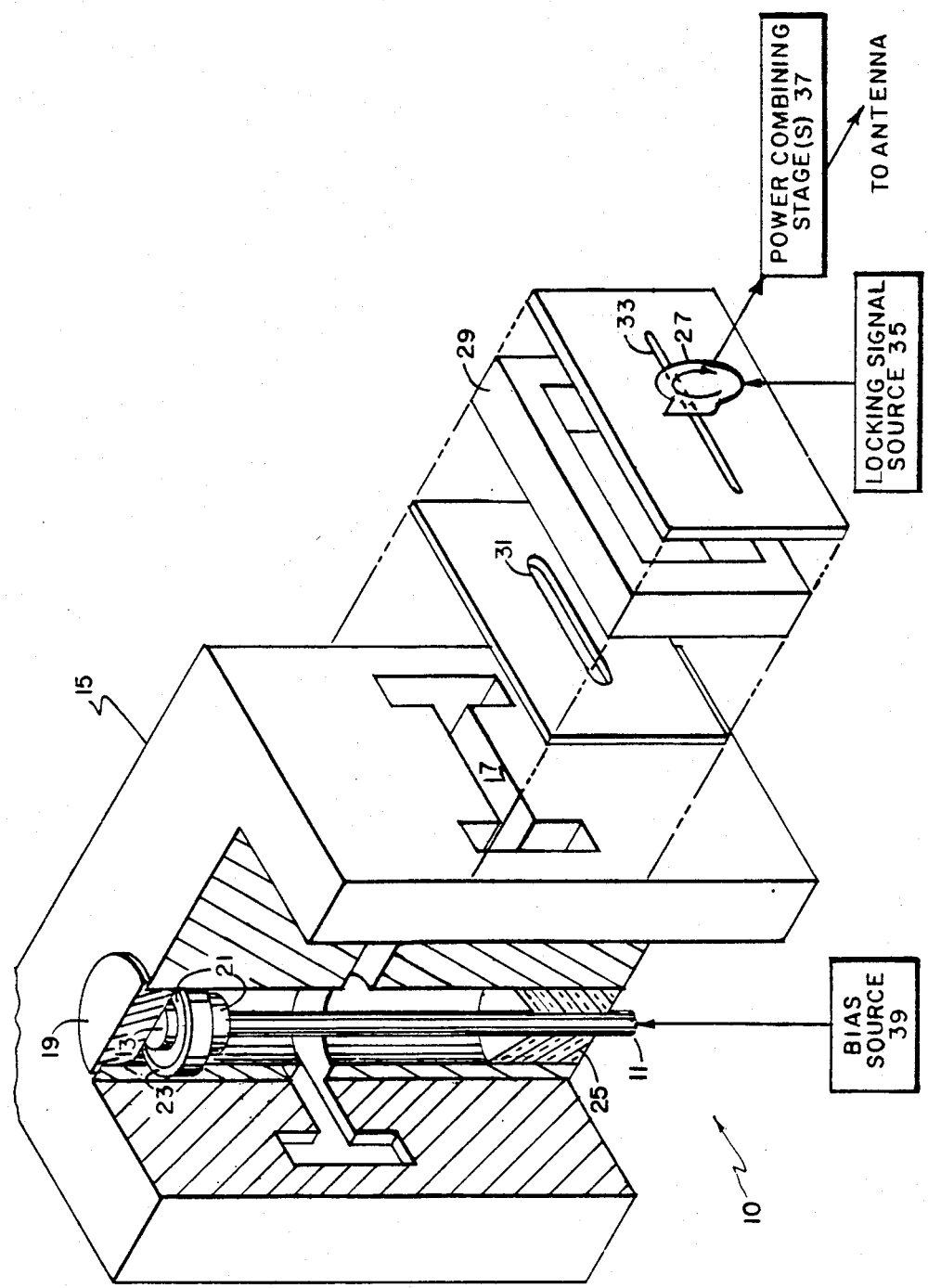

MICROWAVE AMPLIFIER

BACKGROUND OF THE INVENTION

This invention pertains generally to solid state amplifiers for use at microwave frequencies and particularly to amplifiers of such type using IMPATT diodes as the active elements.

Advances in solid state technology have led to the design of solid state transmitters capable of providing greater than 500 watts average power at microwave frequencies. To attain such a power level with known IMPATT diodes, it is necessary to combine the outputs of a plurality of such diodes in a manner, for example, shown in U.S. Pat. No. 4,097,823 (Jerinic et al, issued June 27, 1983 and assigned to the same assignee as this application). It has been found, however, that the instantaneous bandwidth of the just-cited solid state transmitter is limited by the bandwidth of the driver (or locking) stage because the loaded Q of the driver stage is much higher than the loaded Q of any "power combining" stage.

In many applications a limited bandwidth is not desirable. For example, in an application wherein frequency agility is a requirement, limitation of the bandwidth of a solid state transmitter by the driver stage (rather than by any "power combining" stage) is to be avoided.

SUMMARY OF THE INVENTION

With the foregoing in mind, it is an object of this invention to provide a driver stage for use in a multistage solid state transmitter, the bandwidth of such driver stage being wider than the bandwidth of any "power combining" stage.

The foregoing and other objects of this invention are generally attained by providing an amplifier in a broadband driver stage, such amplifier using the single IMPATT diode as its active element. Broadband operation from the driver stage is obtained by coupling the IMPATT diode to a double-ridged dominant mode rectangular waveguide cavity, with an asymmetrical compound coupling iris provided to match the impedance of such cavity to a conventional waveguide circulator through which a locking signal to be amplified is fed from a source and an amplified locking signal is passed to at least one "power combining" stage.

BRIEF DESCRIPTION OF THE DRAWINGS

The foregoing and other objects and many of the attendant advantages of this invention will be readily appreciated as the same becomes better understood by reference to the following detailed description when considered in connection with the accompanying drawing wherein the single FIGURE is a view of an amplifier according to this invention.

DESCRIPTION OF THE PREFERRED EMBODIMENT

Referring now to the single FIGURE, it may be seen that a broadband driver stage 10 according to this invention includes a conventional coaxial IMPATT diode oscillator (not numbered) that is coupled to a rectangular waveguide cavity 11. The coaxial IMPATT diode oscillator (not numbered) comprises an IMPATT diode 13 mounted in a section of coaxial line (not numbered) here fabricated by forming a substantially cylindrical opening in complementary metallic members (not numbered) making up a block 15 with a section of double-ridged waveguide 17 formed therein. The IMPATT diode 13 is mounted between a heat sink 19 and an impedance transformer section 21 to match the relatively low diode impedance to the 50 ohm characteristic impedance of the coaxial line. A dielectric sleeve 23 is provided to prevent the transformer section 21 from being shorted to the outer conductor of the coaxial line section. A tapered termination load 25 is provided on the opposite end of the coaxial line. The material of the termination load 25 here is the material known as "ECCOSORB" (a trademark of Emerson & Cuming, Incorporated, Microwave Products Division, Canton, Mass.).

It will now be appreciated that the IMPATT diode 13 and associated elements constitute an assembly similar to the low power stage shown in U.S. Pat. No. 4,097,823. It will also be appreciated that, as compared to the just-mentioned stage, the loading provided here by the ridges of the double-ridged waveguide 17 is effective to lower the impedance of the waveguide section 17 and to lower the cutoff frequency of the dominant mode, so that the useful bandwidth of the here-contemplated driver stage 10 is wider than that of the mentioned low power stage, or of any known driver stage.

The impedance of the waveguide section 17 is matched to that of a conventional waveguide circulator 27 by means of an asymmetrical compound coupling iris 29. It is well known that discontinuities in waveguides provide reactance which approximates a lumped capacitance, a lumped inductance, or a combination of the two. Thus, discontinuities which constrict the guide in the direction of the electric field as, for example, an E-plane iris, act as a capacitance and discontinuities which constrict the guide in the direction of the magnetic field act as an inductance. When thin metal irises are used as matching elements, the thicker the iris the greater the amount of susceptance provided. The coupling iris 29 has a pair of dissimilar apertures 31, 33 provided therein that are separated by a section of WR90 waveguide which is less than one-eighth of a guide wavelength in length at the center frequency of the amplifier 10. The dimensions of each of the apertures 31, 33 here was empirically determined, respectively, to be 0.475"×0.175" (with a wall thickness of 0.032") and 0.700"×0.060" (with a wall thickness of 0.100"). The spacing between apertures 31, 33 was 0.100". The coupling iris 29 is asymmetric because of the need to match the relatively low impedance of the double-ridged waveguide section 17 to the higher impedance of the conventional waveguide circulator 27.

To complete the illustrated apparatus, a locking signal source 35 and at least one power-combining stage 37 are connected as shown to the circulator 27. The locking signal source 35 may, for example, be a pulsed or continuous wave oscillator operating at a desired microwave frequency with an output power level of, say, 200 milliwatts. Such a level is too low to injection-lock any power-combining stage 37 so the contemplated broadband driver stage 10 is effective to provide (out of the circulator 27) an amplified locking signal at a power level of 1.6 watts. Further, it will be noted that the power level of the amplified locking signal here remains substantially constant as the frequency of the locking signal source 35 is changed over a bandwidth of about 3.5% and that the duty cycle of the locking signal source 35 (if pulsed) may be changed within wide limits.

The bias for the IMPATT diode 13 is derived from a conventional bias source 39.

Having described a preferred embodiment of the invention, it will now be apparent to one of skill in the art that other embodiments incorporating its concept may be used. It is felt, therefore, that this invention should not be restricted to the disclosed embodiment, but rather should be limited only by the spirit and scope of the appended claims.

What is claimed is:

1. In a microwave amplifier utilizing an IMPATT diode as the active element therein, such diode being in circuit with the center conductor of a coaxial line coupled to a resonant cavity, the improvement wherein the resonant cavity is a section of a rectangular double-ridged waveguide, such waveguide having a first short-circuited end and a second end with a compound coupling iris formed therethrough, such iris comprising:
 (a) a first rectangular opening formed centrally through a first wall covering the second end of the rectangular double-ridged waveguide and aligned with such waveguide; and
 (b) a second rectangular opening formed centrally through a second wall outwardly spaced at a distance less than $\frac{1}{8}$ wavelength from the first wall and aligned with such waveguide, the dimensions of the second rectangular opening and the thickness of the second wall being, respectively, greater than the dimensions of the first rectangular opening and the first wall.

* * * * *